United States Patent
Lei et al.

(10) Patent No.: US 11,888,051 B2
(45) Date of Patent: Jan. 30, 2024

(54) STRUCTURES FOR A HIGH-ELECTRON-MOBILITY TRANSISTOR AND RELATED METHODS

(71) Applicant: GLOBALFOUNDRIES Singapore Pte. Ltd., Singapore (SG)

(72) Inventors: Jiacheng Lei, Singapore (SG); Lawrence Selvaraj Susai, Singapore (SG); Joseph James Jerry, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 0 days.

(21) Appl. No.: 16/869,851

(22) Filed: May 8, 2020

(65) Prior Publication Data
US 2021/0351286 A1    Nov. 11, 2021

(51) Int. Cl.
*H01L 29/778* (2006.01)
*H01L 29/66* (2006.01)
*H01L 29/423* (2006.01)
*H01L 29/201* (2006.01)

(52) U.S. Cl.
CPC ........ *H01L 29/7783* (2013.01); *H01L 29/201* (2013.01); *H01L 29/4236* (2013.01); *H01L 29/66462* (2013.01); *H01L 29/7786* (2013.01); *H01L 29/7787* (2013.01)

(58) Field of Classification Search
None
See application file for complete search history.

(56) References Cited

U.S. PATENT DOCUMENTS

| | | | |
|---|---|---|---|
| 8,723,228 B1* | 5/2014 | Oh | H01L 29/34 257/E29.246 |
| 2015/0243775 A1* | 8/2015 | Haeberlen | H01L 29/7787 257/194 |
| 2017/0077277 A1* | 3/2017 | Saito | H01L 29/7786 |
| 2017/0345919 A1* | 11/2017 | Oyama | H01L 29/0657 |
| 2018/0294341 A1* | 10/2018 | Chen | H01L 29/7786 |
| 2019/0280112 A1* | 9/2019 | Shimizu | H01L 21/3065 |
| 2020/0295170 A1* | 9/2020 | Dayeh | H01L 29/7783 |

OTHER PUBLICATIONS

Liu, S. "Al2O3/AlN/GaN MOS-Channel-HEMTs with an AlN Interfacial Layer" IEEE Elec. Dev. Let. vol. 35 No. 7, Jul. 2014 pp. 723-725 (Year: 2014).*

(Continued)

*Primary Examiner* — Grant S Withers
(74) *Attorney, Agent, or Firm* — Thompson Hine LLP; Anthony Canale

(57) ABSTRACT

Structures for a high-electron-mobility transistor and methods of forming a structure for a high-electron-mobility transistor. The high-electron-mobility transistor has a first semiconductor layer, a second semiconductor layer adjoining the first semiconductor layer along an interface, a gate electrode, and a source/drain region. An insulator region is provided in the first semiconductor layer and the second semiconductor layer. The insulator region extends through the interface at a location laterally between the gate electrode and the source/drain region.

19 Claims, 7 Drawing Sheets

(56) References Cited

OTHER PUBLICATIONS

Park, J. "Comparison of AlGaN/GaN High Electron Mobility transistor with AlN or GaN as a cap layer" Research Gate paper available online on Jul. 14, 2015 see action attached for web address pp. 1-2 (Year: 2015).*
Song et al., "Normally off AlGaN/GaN Low-Density Drain Hemt (LDD-HEMT) With Enhanced Breakdown Voltage and Reduced Current Collapse" IEEE Electron Device Letters, vol. 28, No. 3, Mar. 2007.
Kabemura et al., "Enhancement of Breakdown Voltage in AlGaN/GaN HEMTs: Field Plate Plus High-k Passivation Layer and High Acceptor Density in Buffer Layer" IEEE Transactions on Electron Devices, vol. 65, No. 9, Sep. 2018.
Jiang et al., "SiC Trench MOSFET With Shielded Fin-Shaped Gate to Reduce Oxide Field and Switching Loss" IEEE Electron Device Letters, vol. 37, No. 10, Oct. 2016.
Lu et al., "Tri-Gate Normally-Off GaN Power MISFET" IEEE Electron Device Letters, vol. 33, No. 3, Mar. 2012.
Tanaka et al., "Impact of Grounding the Bottom Oxide Protection Layer on the Short-Circuit Ruggedness of 4H—SiC Trench MOSFETs" Proceedings of the 26th International Symposium on Power Semiconductor Devices & IC's Jun. 15-19, 2014 Waikoloa, Hawaii.
Asubar et al, "Highly reduced current collapse in AlGaN/GaN high-electron-mobility transistors by combined application of oxygen plasma treatment and field plate structures" Japanese Journal of Applied Physics 55, 04EG07 (2016).
Lu et al., "Low Leakage Normally-off Tri-gate GaN MISFET" Proceedings of the 2012 24th International Symposium on Power Semiconductor Devices and ICs Jun. 3-7, 2012—Bruges, Belgium.

* cited by examiner

STRUCTURES FOR A HIGH-ELECTRON-MOBILITY TRANSISTOR AND RELATED METHODS

BACKGROUND

The invention relates generally to integrated circuits and semiconductor device fabrication and, in particular, to structures for a high-electron-mobility transistor and methods of forming a structure for a high-electron-mobility transistor.

High-voltage power electronic devices, such as high-electron-mobility transistors, may be fabricated using III-V compound semiconductors to exploit their material properties, such as a carrier mobility that is greater than the carrier mobility of silicon. III-V compound semiconductors are obtained by combining group III elements (aluminum, gallium, indium) with group V elements (nitrogen, phosphorus, arsenic, antimony). A high-electron-mobility transistor may include a heterojunction between III-V compound semiconductor materials having different band gaps, such as a heterojunction between binary gallium nitride and trinary aluminum-gallium nitride. During operation, a two-dimensional electron gas is formed near an interface at the heterojunction of the high-electron-mobility transistor. The two-dimensional electron gas defines the channel of the high-electron-mobility transistor.

Due to the high electron mobility of the two-dimensional electron gas, HEMTs offer high conduction and low losses in comparison to other types of transistors. However, the gate dielectric layer near the gate edge may be susceptible to premature breakdown under high drain bias in power switching applications.

Improved structures for a high-electron-mobility transistor and methods of forming a structure for a high-electron-mobility transistor are needed.

SUMMARY

In an embodiment of the invention, a structure includes a high-electron-mobility transistor having a first semiconductor layer, a second semiconductor layer adjoining the first semiconductor layer along an interface, a gate electrode, and a source/drain region. The structure further includes an insulator region in the first semiconductor layer and the second semiconductor layer. The insulator region extends through the interface at a location that is laterally between the gate electrode and the source/drain region.

In an embodiment of the invention, a method includes forming a high-electron-mobility transistor including a first semiconductor layer and a second semiconductor layer adjoining the first semiconductor layer along an interface, forming an insulator region in the first semiconductor layer and the second semiconductor layer, forming a gate electrode of the high-electron-mobility transistor, and forming a source/drain region of the high-electron-mobility transistor. The insulator region extends through the interface at a location laterally between the gate electrode and the source/drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
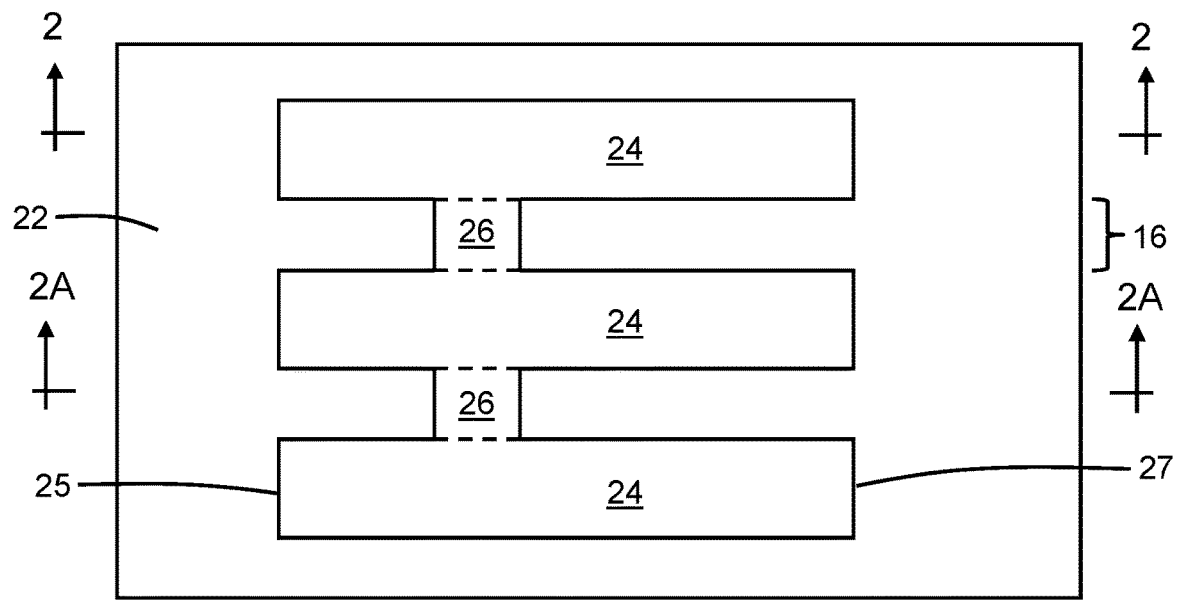
FIG. 1 is top view of a structure for a high-electron-mobility transistor in accordance with embodiments of the invention.
Figure 2:
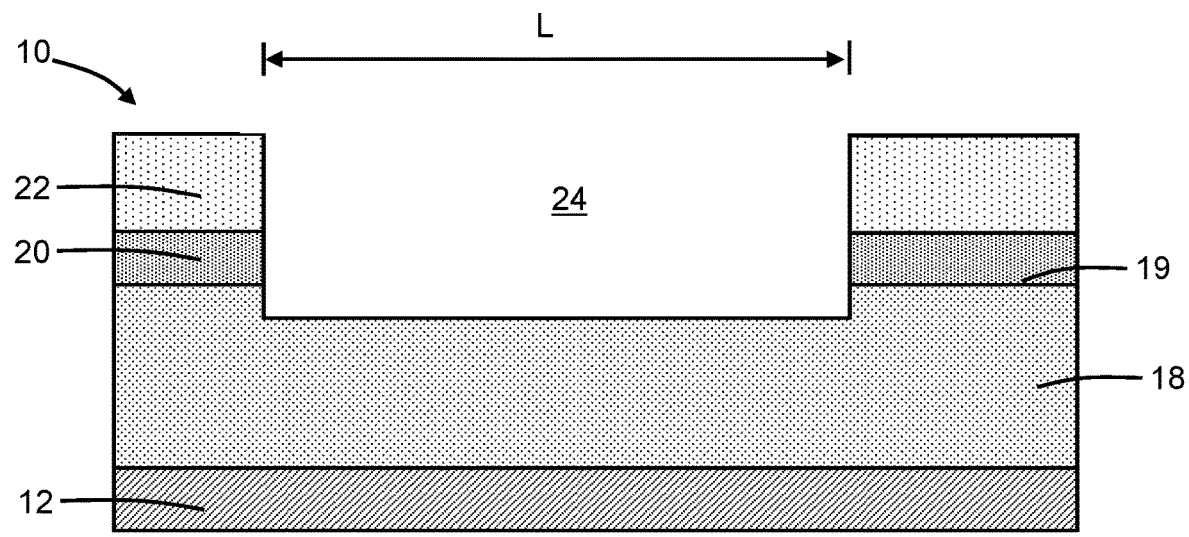
FIG. 2 is a cross-sectional view taken generally along line 2-2 in FIG. 1.
Figure 2A:
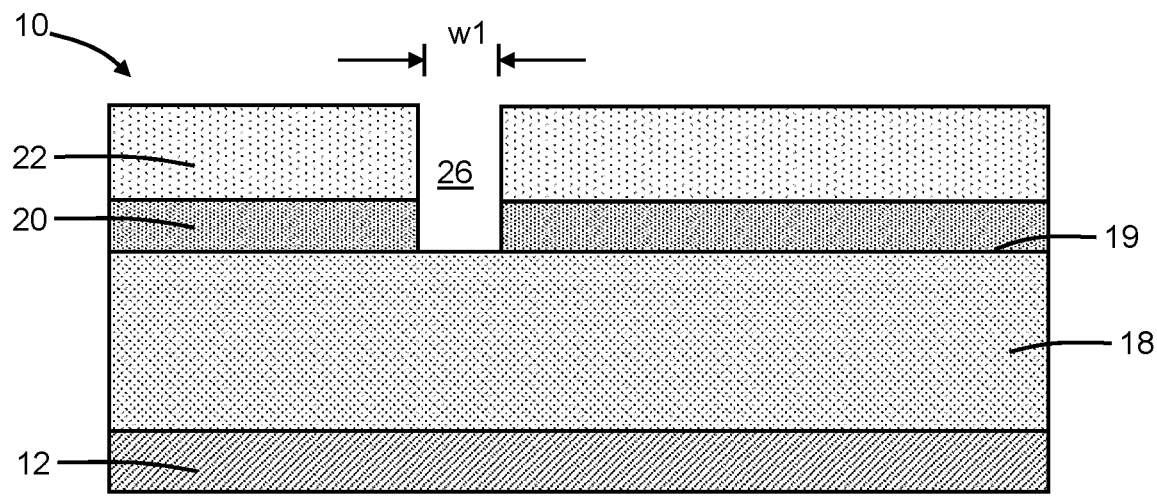
FIG. 2A is a cross-sectional view taken generally along line 2A-2A in FIG. 1.

With reference to FIGS. 1, 2, 2A and in accordance with embodiments of the invention, a structure 10 for a high-electron-mobility transistor is formed on a top surface of a semiconductor substrate 12. The semiconductor substrate 12 may be comprised of a single-crystal semiconductor material, such as single-crystal silicon. The semiconductor substrate 12 may be a bulk substrate comprised of single-crystal semiconductor material (e.g., single-crystal silicon), and the bulk substrate may be lightly doped to have p-type electrical conductivity.

A semiconductor layer 18, a semiconductor layer 20, and a dielectric layer 22 are formed in a layer stack over the semiconductor substrate 12. The semiconductor layers 18, 20 may be serially formed using an epitaxial growth process, such as metalorganic chemical vapor deposition, and the semiconductor layers 18, 20 may each include single-crystal material. The semiconductor layer 18 may include multiple sub-layers that are tailored in terms of material and layer thickness to accommodate lattice mismatch between the crystal structure of the semiconductor substrate 12 and the crystal structure of the portion of the semiconductor layer 18 proximate to the semiconductor layer 20. The semiconductor layer 18 may be comprised of a III-V compound semiconductor material, such as gallium nitride. The semiconductor layer 20 may be comprised of a III-V compound semiconductor material, such as aluminum-gallium nitride. The semiconductor layers 18, 20 adjoin along an interface 19 that may define a heterojunction. A two-dimensional electron gas filled with highly-mobile and abundant electrons may be generated, during device operation, near the interface 19. The dielectric layer 22 may be comprised of a dielectric material, such as silicon nitride, silicon dioxide, or aluminum oxide, and may be deposited by chemical vapor deposition.

The semiconductor layer 18, semiconductor layer 20, and dielectric layer 22 are patterned by one or more lithography and etching processes to define trenches 24 and gate windows 26 as recesses that interconnect adjacent trenches 24. Each of the trenches 24 terminates along its length at opposite ends 25, 27, and the gate windows 26 are spaced from the opposite ends 25, 27 of the trenches 24. Strips 16 of the materials of the semiconductor layer 18, semiconductor layer 20, and dielectric layer 22 are arranged between adjacent trenches 24, and the gate windows 26 extend through the strips 16 to connect the adjacent trenches 24. The trenches 24 penetrate fully through the dielectric layer 22 and the semiconductor layer 20, and the trenches 24 extend to a shallow depth into the semiconductor layer 18. The gate windows 26 penetrate fully through the dielectric layer 22 and the semiconductor layer 20 to the semiconductor layer 18. The trenches 24 have a length, L, in a longitudinal direction and the gate windows have a width, w1, in the longitudinal direction.

Figure 3:
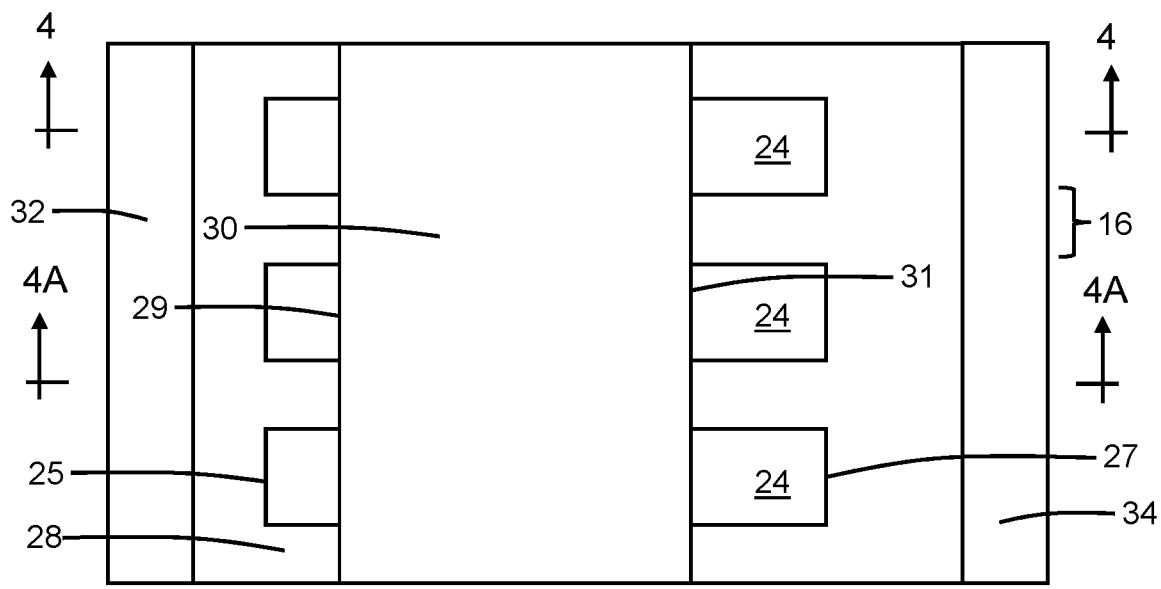
FIG. 3 is a top view of the structure at a fabrication stage subsequent to FIG. 1.
Figure 4:
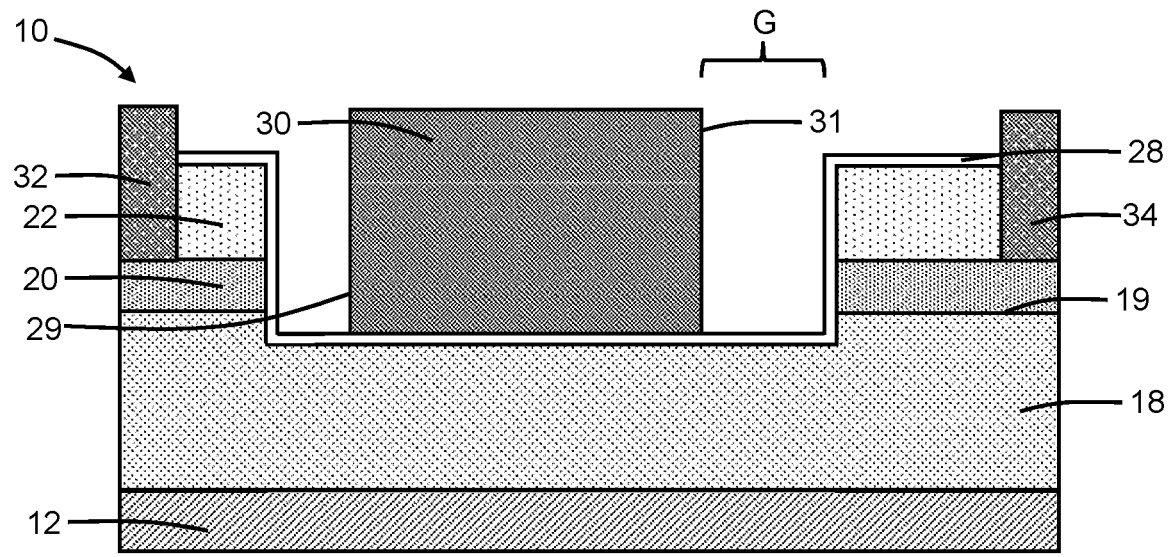
FIG. 4 is a cross-sectional view taken generally along line 4-4 in FIG. 3.
Figure 4A:
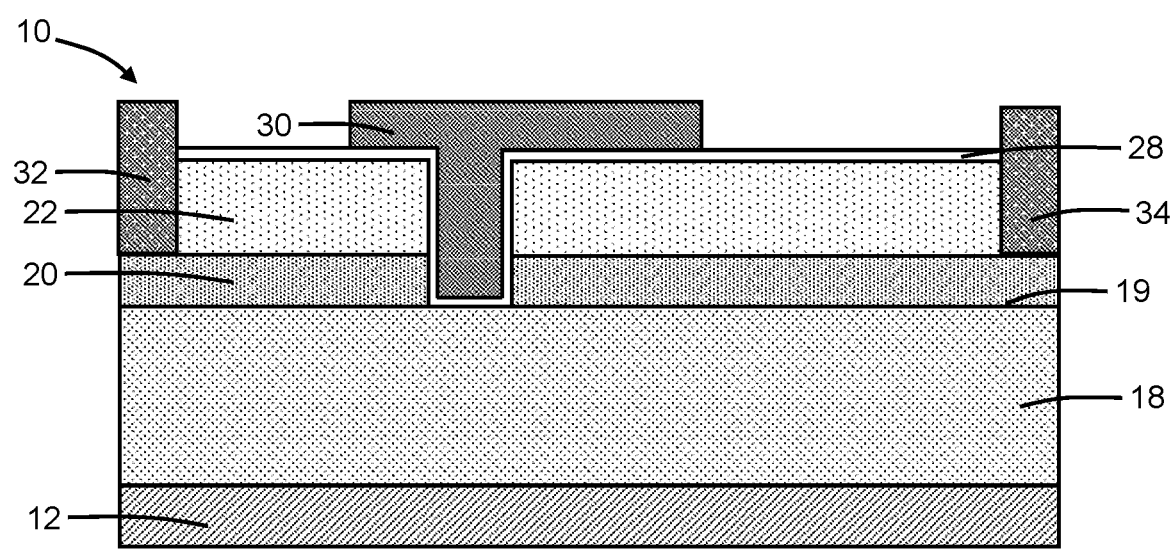
FIG. 4A is a cross-sectional view taken generally along line 4A-4A in FIG. 3.

With reference to FIGS. 3, 4, 4A in which like reference numerals refer to like features in FIGS. 1, 2, 2A and at a subsequent fabrication stage of the processing method, a conformal dielectric layer 28 is deposited by, for example, atomic layer deposition over the structure 10. The conformal dielectric layer 28 may be comprised of a dielectric material, such as silicon nitride or aluminum oxide. The conformal dielectric layer 28 coats the trenches 24 and the gate windows 26 with a thin layer of dielectric material that may have a uniform or substantially uniform thickness that is independent of position.

A gate electrode 30 is formed in the gate windows 26 and on portions of the trenches 24 laterally arranged between the gate windows 26. The portions of the gate electrode 30 inside the gate windows 26 are positioned directly on the conformal dielectric layer 28 over the semiconductor layer 20. The gate electrode 30 also overlaps slightly with the strips 16 adjacent to the gate windows 26. The gate electrode 30 may be comprised of a metal, such as a metal nitride, and may be patterned with lithography and etching processes to define its shape. The gate electrode 30 is positioned indirectly on the semiconductor layer 18 with the conformal dielectric layer 28 as an intervening coating that prevents direct contact. The portion of the conformal dielectric layer 28 positioned between the gate electrode 30 and the semiconductor layers 18, 20 provides a gate dielectric layer.

The gate electrode 30 only partially fills the trenches 24 in addition to fully filling the gate windows 26. The gate electrode 30 is spaced by a gap inside each of the trenches 24 from the opposite ends 25, 27 of the trenches 24. In particular, the gate electrode 30 includes an edge 29 and an edge 31 that is opposite to the edge 29. The edge 31 of the portion of the gate electrode 30 inside each of the trenches 24 is spaced by a gap, G, from the end 27 of each trench 24. The edge 29 of the portion of the gate electrode 30 inside each of the trenches 24 is also spaced by a gap from the end 25 of each trench 24.

Source/drain regions 32, 34 are formed by patterning openings with lithography and etching processes in the dielectric layer 22 and depositing a metal, such as a metal nitride, that may be patterned with lithography and etching processes. The source/drain regions 32, 34 may directly contact the semiconductor layer 20. As used herein, the term "source/drain region" means a conductive region that can function as either a source or a drain of a high-electron-mobility transistor. In an embodiment, the source/drain region 32 may provide a source in the structure 10, and the source/drain region 34 may provide a drain in the structure 10.

Figure 5:
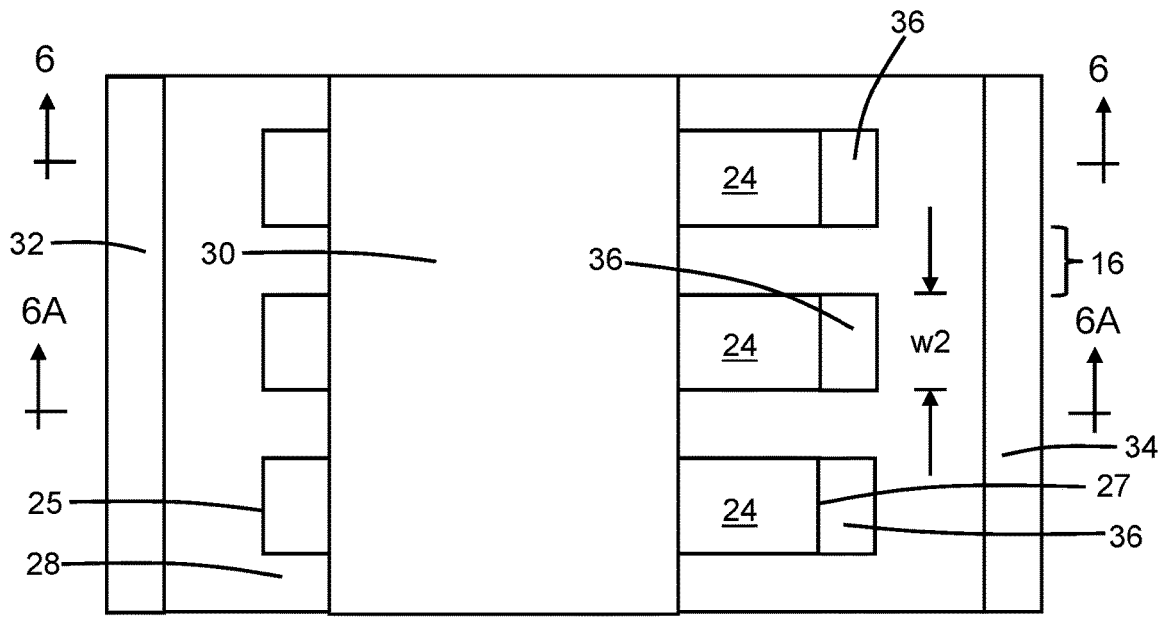
FIG. 5 is a top view of the structure at a fabrication stage subsequent to FIG. 3.
Figure 6:
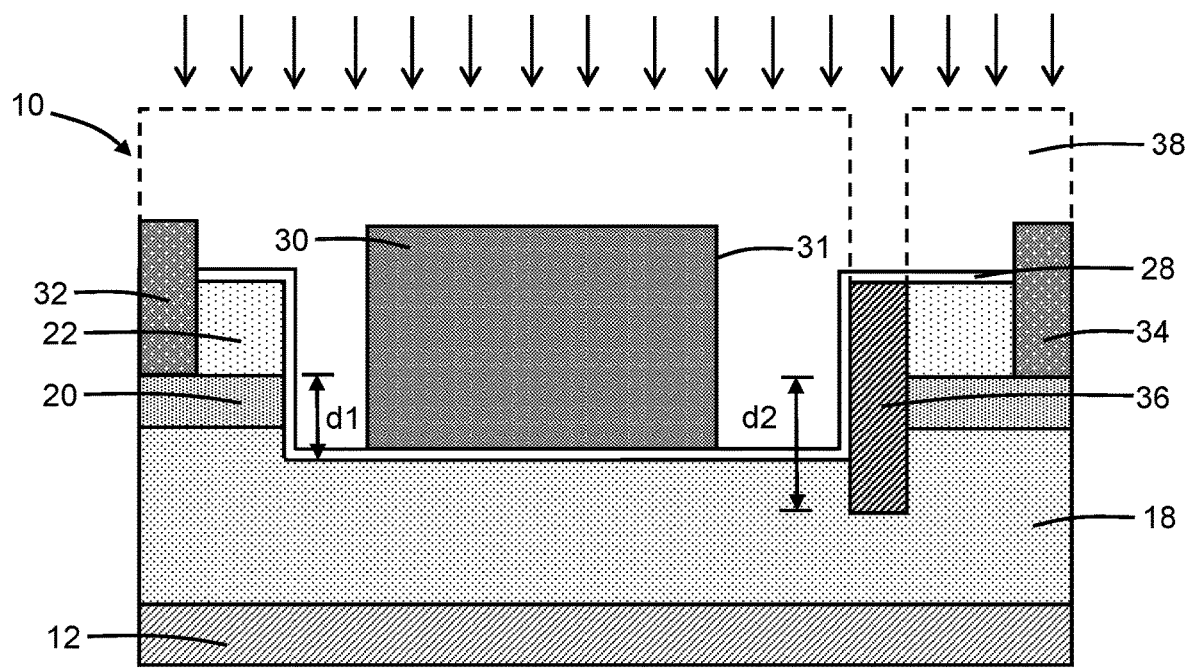
FIG. 6 is a cross-sectional view taken generally along line 6-6 in FIG. 5.
Figure 6A:
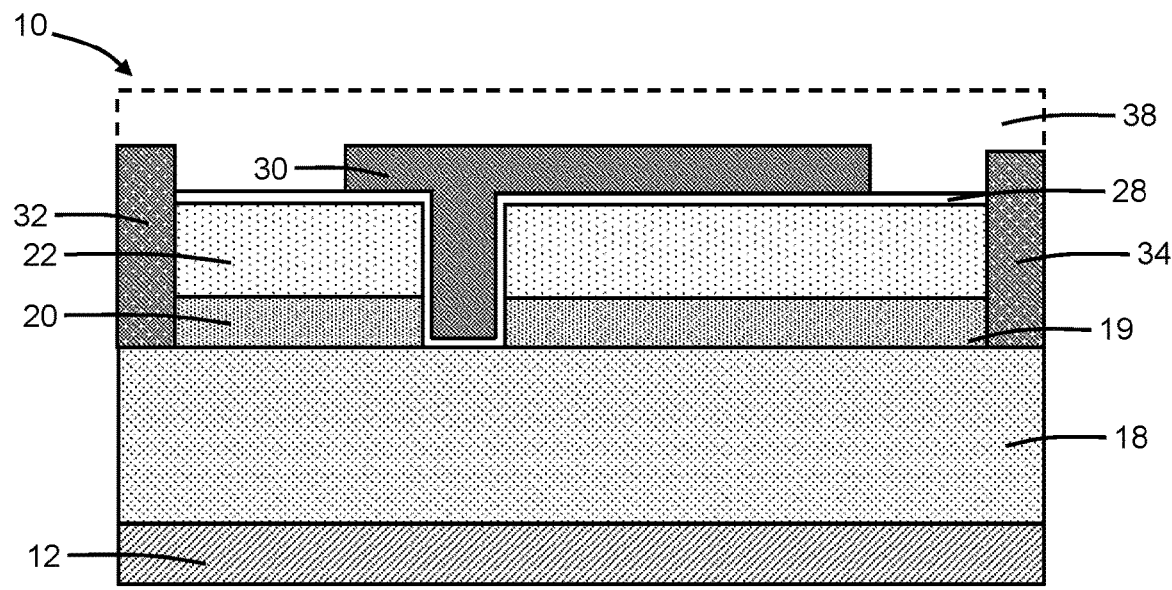
FIG. 6A is a cross-sectional view taken generally along line 6A-6A in FIG. 5.

With reference to FIGS. 5, 6, 6A in which like reference numerals refer to like features in FIGS. 3, 4, 4A and at a subsequent fabrication stage of the processing method, insulator regions 36 are formed at the semiconductor layers 18, 20 proximate to the end 27 of each trench 24 and, therefore, between the source/drain region 34 and the portions of the gate electrode 30 inside the trenches 24. The insulator regions 36 may extend or penetrate through the interface 19 between the semiconductor layer 18 and the semiconductor layer 20. A lower portion of each insulator region 36 is positioned in the semiconductor layer 18, an upper portion of each insulator region 36 is positioned in the semiconductor layer 20, and the interface 19 is located between the different portions of each insulator region 36. In an embodiment, the insulator regions 36 may extend to a depth, d2, that is greater than the depth, d1, of a bottom of the trenches 24 and, therefore, a lower portion of each insulator region 36 may be positioned beneath the gate electrode 30 relative to the semiconductor substrate 12. The semiconductor layer 18 is not modified at depths greater than depth, d2.

The insulator regions 36 may be formed by, for example, an ion implantation process with an implantation mask 38 determining the implanted locations. The implantation mask 38 may include a layer of a dielectric material, such as silicon nitride, that is patterned with lithography and etching processes to define openings at the intended locations for the insulator regions 36. Alternatively, the implantation mask 38 may be comprised of photoresist that is patterned with lithography and etching processes to define the openings at the intended locations for the insulator regions 36. In an alternative embodiment, the insulator regions 36 may be formed by introducing an elemental species with a plasma process.

The ion implantation process introduces energetic ions, as indicated diagrammatically by the single-headed arrows, of an elemental species that stop in the localized portions of the semiconductor layer 18 and the semiconductor layer 20 to form the insulator regions 36. The ions may be generated from a suitable source gas and implanted with one or more implantation conditions using an ion implantation tool. The conditions (e.g., ion species, dose, kinetic energy) of the implantation may be selected to tune the characteristics of the insulator regions 36. In an embodiment, the implanted ions may be ions of the elemental species nitrogen. In an embodiment, the implanted ions may be ions of the elemental species fluorine. In an embodiment, the implanted ions may be ions of the elemental species iron. Implanted portions of the dielectric layer 22 may also be included in the insulator regions 36, despite representing localized portions of modified dielectric material instead of modified semiconductor material, because these portions of the dielectric layer 22 may contain a concentration of the implanted atomic species.

The atomic concentration of the implanted species is sufficient to convert the implanted semiconductor materials of implanted portions of the semiconductor layer 18 and the semiconductor layer 20 within the insulator regions 36 into an electrically-insulating material. In an embodiment, multiple ion implantation processes may be employed to form the insulator regions 36. For example, nitrogen may be implanted at an energy in a range of 20 keV to 30 keV with an ion dose in a range of $5 \times 10^{13}$ ions per square centimeter (cm$^2$) to 1×10$^{14}$ ions per cm$^2$, implanted at an energy in a range of 40 keV to 50 keV with an ion dose in a range of 8×10$^{13}$ ions per cm$^2$ to 1.5×10$^{14}$ ions per cm$^2$, and implanted at an energy in a range of 60 keV to 70 keV with an ion dose in a range of 5×10$^{13}$ ions per cm$^2$ to 1×10$^{14}$ ions per cm$^2$. In this example, the average atomic concentration of the implanted species nitrogen in the semiconductor layers 18, 20 may range from 5×10$^{18}$ atoms per cubic centimeter (cm$^3$) to 1.5×10$^{19}$ atoms per cm$^3$.

The implantation mask 38 has a thickness and stopping power sufficient to prevent masked areas against being implanted. As a result, masked portions of the semiconductor materials of the semiconductor layers 18, 20 in the strips 16 between the trenches 24 are not modified by the implantation process. In addition, the spaces between the ends 25 of the trenches 24 and the source/drain region 32 are masked during implantation such that the insulator regions 36 are only formed in localized positions adjacent to the ends 27 of the trenches 24. As a result, the insulator regions 36 are surrounded on at least three sides by the semiconductor materials of the semiconductor layers 18, 20 that are not modified by the introduction of the implanted atomic species. Following implantation, the implantation mask 38 may be removed.

Each of the insulator regions 36 is positioned at a location laterally between the end 27 of one of the trenches 24 and the source/drain region 34. Unimplanted portions of the semiconductor layers 18, 20 and an intact portion of the interface 19 are located between each insulator region 36 and the source/drain region 34. In an embodiment, the trenches 24 and the insulator regions 36 may have the same or approximately the same width, w2, in which case the unimplanted portions of the semiconductor layers 18, 20 positioned between adjacent insulator regions 36 have the same width as the strips 16. In an embodiment, the insulator regions 36 may overlap with the ends 27 of the trenches 24.

The insulator regions 36 provide localized volumes of semiconductor material having low electrical conductivity in the semiconductor layers 18, 20 in comparison with unimplanted volumes of the semiconductor material of the semiconductor layers 18, 20. During device operation, each insulator region 36 effectively displaces the two-dimensional electron gas laterally away from the end 27 of its associated trench 24 and the edge 31 of the gate electrode 30 inside each trench 24 because the interface 19 between the semiconductor layers 18, 20 is interrupted and the high electric field that occurs proximate to the edge 31 of the gate electrode 30 is shifted laterally toward the source/drain region 34 and away from the edge 31. The lateral displacement of the two-dimensional electron gas reduces the susceptibility of the conformal dielectric layer 28 proximate to the end 27 on each trench 24 adjacent to the edge 31 of the gate electrode 30 to dielectric breakdown, which improves gate reliability. The insulator regions 36 may be added without degrading the ON-resistance of the high-electron-mobility transistor because the localized ion-implanted regions of the semiconductor layers 28, 30 near the ends 27 of the trenches 24 are not normally current-conducting.

Figure 7:
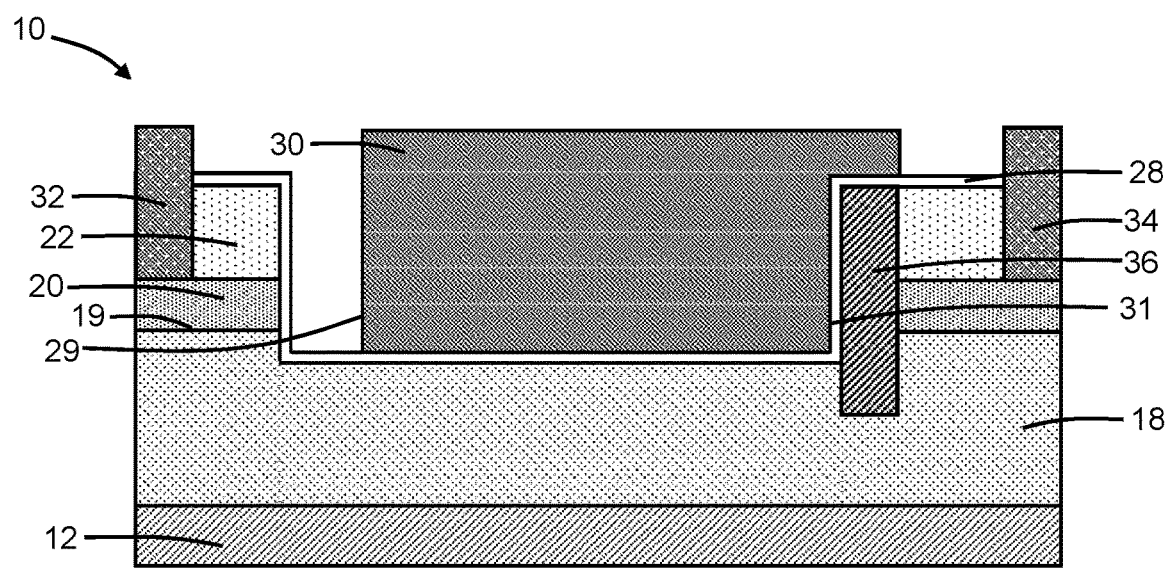
FIG. 7 is cross-sectional view of a structure for a high-electron-mobility transistor in accordance with alternative embodiments of the invention.

With reference to FIG. 7 in which like reference numerals refer to like features in FIG. 6 and in accordance with alternative embodiments of the invention, the gate electrode 30 may be modified to fully occupy the space between the end 27 of each trench 24 and gate window 26 such that the edge 31 of the gate electrode 30 directly contacts the dielectric layer 22 at the end 27 of each trench 24 and the gap between the end 27 and the edge 31 is eliminated. The gate electrode 30 may also include a portion that extends beyond the end 27 of each trench 24 and that overhangs the dielectric layer 22 to define a field plate. In an embodiment, the insulator regions 36 may be formed before the formation of the gate electrode 30 because of the overlap of the gate electrode 30 with the dielectric layer 22 adjacent to the ends 27 of the trenches 24.

Figure 8:
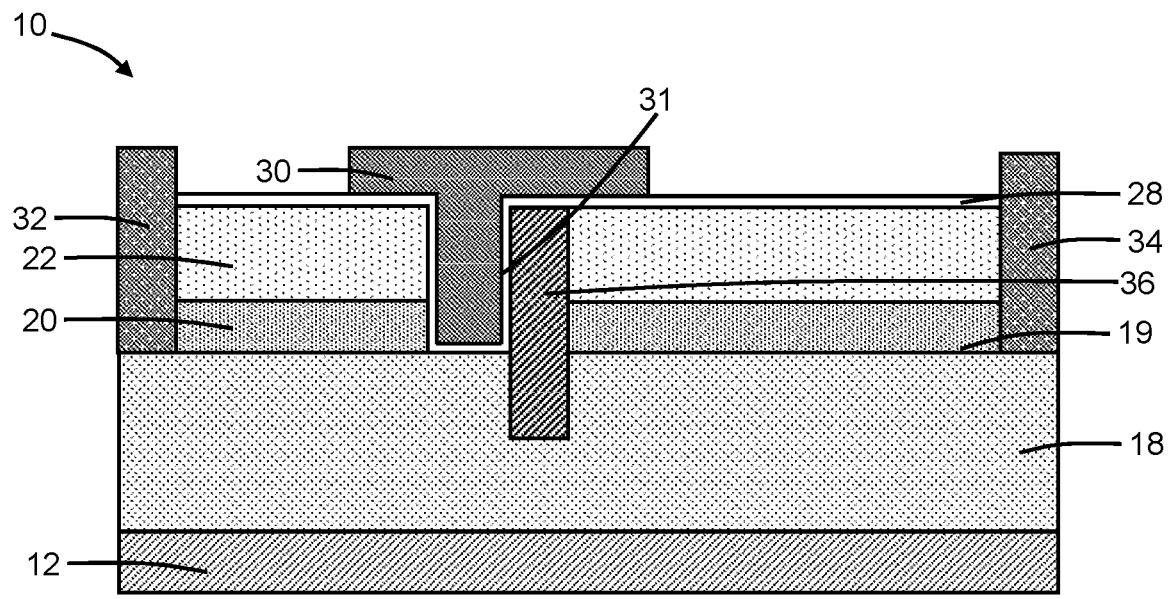
FIGS. 8, 8A are cross-sectional views of a structure for a high-electron-mobility transistor in accordance with alternative embodiments of the invention.
Figure 8A:
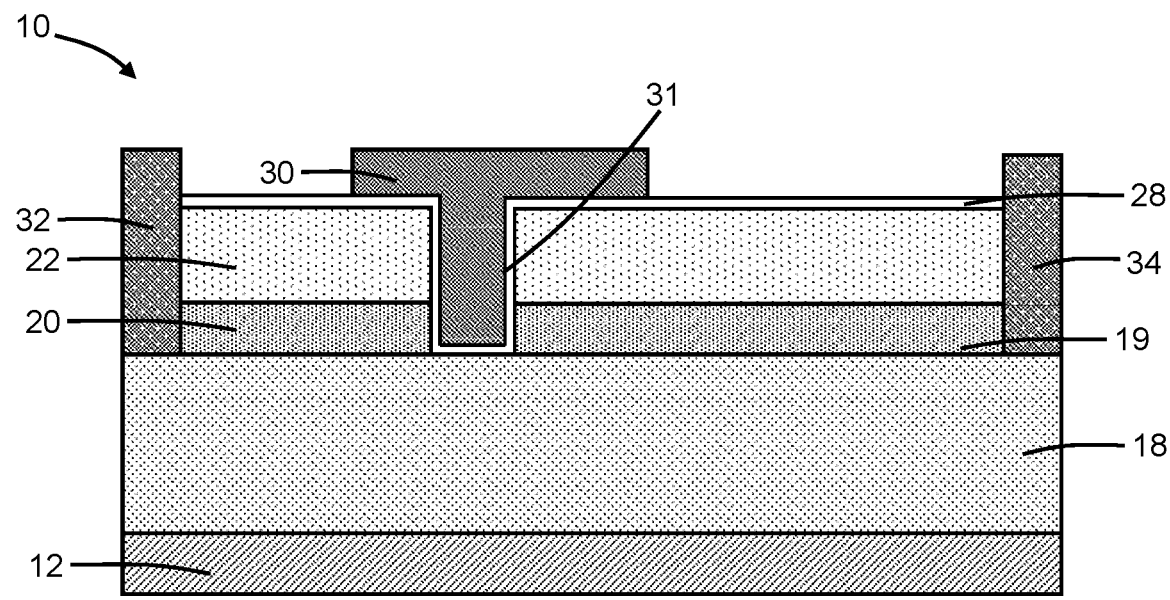

With reference to FIGS. 8, 8A in which like reference numerals refer to like features in FIGS. 6, 6A and in accordance with alternative embodiments of the invention, the structure 10 may omit the trenches 24 and include a single gate window 26 that is arranged laterally between the source/drain region 32 and the source/drain region 34. The edge 31 of the gate electrode 30 directly contacts the dielectric layer 22 at the side edge of the gate window 26. The insulator regions 36 are positioned adjacent to different portions of the gate electrode 30 and the source/drain region 34, and non-modified strips 16 of the semiconductor layers 18, 20 are positioned between adjacent insulator regions 36.

Figure 9:
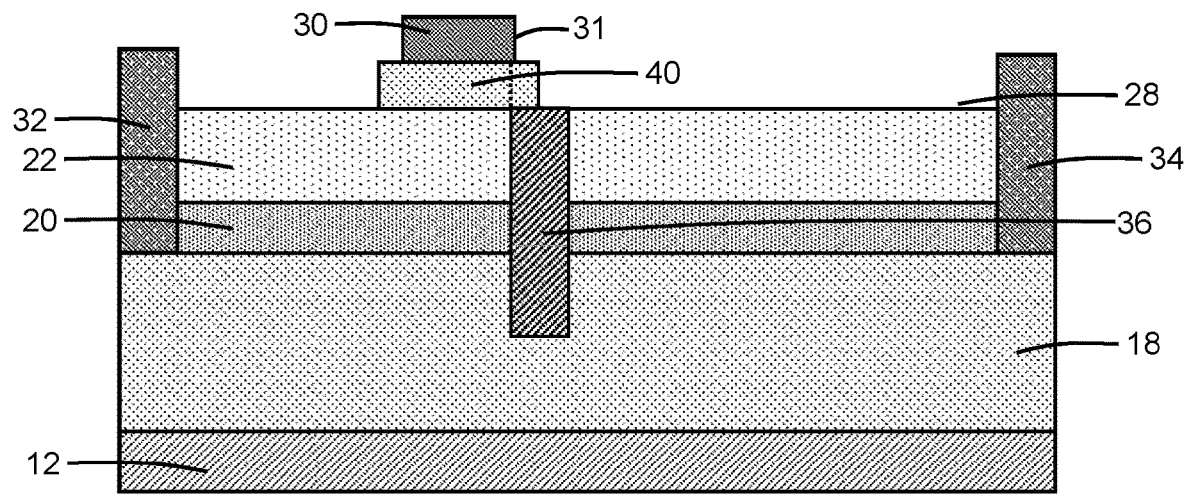
FIGS. 9, 9A are cross-sectional views of a structure for a high-electron-mobility transistor in accordance with alternative embodiments of the invention.
Figure 9A:
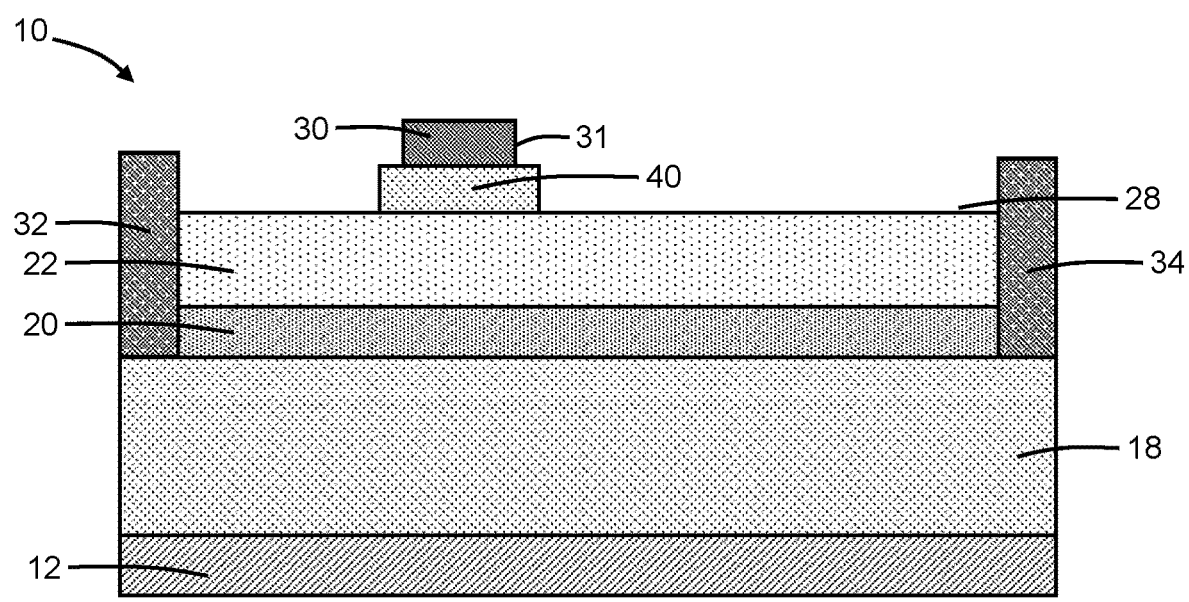

With reference to FIGS. 9, 9A in which like reference numerals refer to like features in FIGS. 6, 6A and in accordance with alternative embodiments of the invention, the structure 10 may omit the trenches 24 and be structured as a planar high-electron-mobility transistor. An additional layer 40 of compound semiconductor material (e.g., p-type gallium nitride or p-type aluminum-gallium nitride) may be positioned between the gate electrode 30 and the dielectric layer 22. A portion of each insulator region 36 may also be located in the layer 40, as indicated by the dotted line. The insulator regions 36 are positioned between different portions of the gate electrode 30 and the source/drain region 34. Non-modified strips 16 of the semiconductor layers 18, 20 are positioned between adjacent insulator regions 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a high-electron-mobility transistor including a substrate having an upper surface that faces upwards in a first direction perpendicular to the upper surface, a first semiconductor layer, a second semiconductor layer adjoining the first semiconductor layer along an interface, a first trench and a second trench that are adjacently located in the first semiconductor layer and the second semiconductor layer, a gate window in the first semiconductor layer, a gate electrode located in the first trench, the second trench, and the gate window, a first insulator region in the first semiconductor layer and the second semiconductor layer, a second insulator region in the first semiconductor layer and the second semiconductor layer, and a source/drain region, the gate window connecting the first trench to the second trench, the first semiconductor layer comprising a first compound semiconductor material, the second semiconductor layer comprising a second compound semiconductor material different in composition from the first compound semiconductor material, the first insulator region and the second insulator region extending through the interface, the first insulator region laterally positioned between an end of the first trench and the source/drain region, and the second insulator region laterally positioned between an end of the second trench and the source/drain region, and
wherein a portion of the first insulator region extends below a lowest extent of a first bottom-most surface of the first trench in the first direction, and a portion of the second insulator region extends below a lowest extent of a second bottom-most surface of the second trench in the first direction.

2. The structure of claim 1 wherein the first compound semiconductor material is aluminum-gallium nitride, and the second compound semiconductor material is gallium nitride.

3. The structure of claim 1 wherein the high-electron-mobility transistor includes a conformal dielectric layer on the first semiconductor layer and the second semiconductor layer at the end of the first trench, the conformal dielectric layer is positioned between the first insulator region and the end of the first trench, and the gate electrode includes a first portion positioned in the first trench with a gap between the first portion of the gate electrode and the conformal dielectric layer at the end of the first trench.

4. The structure of claim 1 wherein the-high-electron-mobility transistor includes a conformal dielectric layer on the first semiconductor layer and the second semiconductor layer at the end of the first trench, the conformal dielectric layer is positioned between the first insulator region and the end of the first trench, the gate electrode includes a first portion positioned in the first trench, and the first portion of the gate electrode is in direct contact with the conformal dielectric layer at the end of the first trench.

5. The structure of claim 1 wherein the first semiconductor layer and the second semiconductor layer include respective third portions laterally positioned between the first insulator region and the second insulator region.

6. The structure of claim 5 wherein the first semiconductor layer includes a first strip between the first trench and the second trench, the second semiconductor layer includes a second strip between the first trench and the second trench, and the first strip, the second strip, and the respective third portions of the first semiconductor layer and the second semiconductor layer have equal widths.

7. The structure of claim 6 wherein the first trench and the first insulator region have equal widths, and the second trench and the second insulator region have equal widths.

8. The structure of claim 1 wherein the gate electrode includes a first portion positioned in the first trench, the first trench extends through the first semiconductor layer past the interface to a first depth in the second semiconductor layer, the first insulator region extends to a second depth in the second semiconductor layer, and the second depth is greater than the first depth.

9. The structure of claim 8 wherein the gate electrode includes a second portion that extends beyond the end of the first trench toward the source/drain region.

10. The structure of claim 1 wherein the first trench and the first insulator region have approximately equal widths, and the second trench and the second insulator region have approximately equal widths.

11. The structure of claim 1 wherein the first insulator region is arranged in the first semiconductor layer and the second semiconductor layer at a first localized position that is laterally between the end of the first trench and the source/drain region, and the second insulator region is arranged in the first semiconductor layer and the second semiconductor layer at a second localized position that is laterally between the end of the second trench and the source/drain region.

12. The structure of claim 11 wherein the first insulator region comprises nitrogen, fluorine, or iron in the first semiconductor layer and the second semiconductor layer at the first localized position, and the second insulator region comprises nitrogen, fluorine, or iron in the first semiconductor layer and the second semiconductor layer at the second localized position.

13. The structure of claim 1 wherein the first insulator region and the second insulator region each comprise nitrogen, fluorine, or iron.

14. The structure of claim 1 wherein the first insulator region overlaps with the end of the first trench, and the second insulator region overlaps with the end of the second trench.

15. The structure of claim 1 wherein the high-electron-mobility transistor includes a dielectric layer on the first semiconductor layer, the first semiconductor layer is positioned between the second semiconductor layer and the dielectric layer, the dielectric layer is comprised of a dielectric material, and the first insulator region and the second insulator region extend into the dielectric layer.

16. The structure of claim 1 wherein the first compound semiconductor material is gallium nitride, and the second compound semiconductor material is aluminum-gallium nitride.

17. A method comprising:
- forming a first semiconductor layer and a second semiconductor layer adjoining the first semiconductor layer along an interface, wherein the first semiconductor layer comprises a first compound semiconductor material, and the second semiconductor layer comprises a second compound semiconductor material different in composition from the first compound semiconductor material;
- forming a first trench located in the first semiconductor layer and the second semiconductor layer;
- forming a second trench located in the first semiconductor layer and the second semiconductor layer, wherein the second trench is adjacent to the first trench;
- forming a gate window in the first semiconductor layer, wherein the gate window connects the first trench to the second trench;
- forming a source/drain region of a high-electron-mobility transistor;
- forming a first insulator region of the high-electron-mobility transistor in the first semiconductor layer and the second semiconductor layer, wherein the first insulator region is laterally positioned between an end of the first trench and the source/drain region;
- forming a second insulator region of the high-electron-mobility transistor in the first semiconductor layer and the second semiconductor layer, wherein the second insulator region is laterally positioned between an end of the second trench and the source/drain region; and
- forming a gate electrode of the high-electron-mobility transistor, wherein the gate electrode is located in the first trench, the second trench, and the gate window,
- wherein the high-electron-mobility transistor includes a substrate having an upper surface that faces upwards in a first direction perpendicular to the upper surface, the first insulator region and the second insulator region each extend through the interface, a portion of the first insulator region extends below a lowest extent of a first bottom-most surface of the first trench in the first direction, and a portion of the second insulator region extends below a lowest extent of a second bottom-most surface of the second trench in the first direction.

18. The method of claim 17 wherein the first compound semiconductor material comprises aluminum-gallium nitride, and the second compound semiconductor material comprises gallium nitride.

19. The method of claim 17 wherein the first semiconductor layer and the second semiconductor layer include respective second portions laterally arranged between the first insulator region and the second insulator region.

* * * * *